(12) United States Patent
Dean et al.

(10) Patent No.: US 6,349,248 B1
(45) Date of Patent: Feb. 19, 2002

(54) METHOD AND SYSTEM FOR PREDICTING FAILURES IN A POWER RESISTIVE GRID OF A VEHICLE

(75) Inventors: Jason A. Dean, Erie, PA (US); Theodore Clark Brown, Ripley, NY (US); Ajith Kuttannair Kumar, Erie; Bret Dwayne Worden, Union City, both of PA (US)

(73) Assignee: General Electric Company

( * ) Notice: Subject to any disclaimer, the term of this patent is extended or adjusted under 35 U.S.C. 154(b) by 0 days.

(21) Appl. No.: 09/473,328

(22) Filed: Dec. 28, 1999

Related U.S. Application Data

(60) Provisional application No. 60/162,303, filed on Oct. 28, 1999.

(51) Int. Cl.⁷ .............................................. G06F 17/00
(52) U.S. Cl. ...................... 701/19; 246/169 R; 701/29; 324/555
(58) Field of Search .................. 701/1, 19, 29, 701/31, 35; 318/63, 375, 380; 324/73.1, 555; 246/169 R

(56) References Cited

U.S. PATENT DOCUMENTS

| | | |
|---|---|---|
| 5,157,610 A | 10/1992 | Asano et al. |
| 5,266,891 A | 11/1993 | Kumar et al. |
| 5,363,039 A | 11/1994 | Kumar et al. |
| 5,446,389 A | 8/1995 | Lenz |
| 5,517,093 A | 5/1996 | Augustyniak et al. |
| 5,566,091 A | 10/1996 | Schricker et al. |
| 5,806,011 A | 9/1998 | Azzaro et al. |
| 5,815,071 A | 9/1998 | Doyle |
| 5,845,272 A | 12/1998 | Morjaria et al. |
| 5,950,147 A | 9/1999 | Sarangapani et al. |
| 5,961,567 A | 10/1999 | Azzaro et al. |
| 6,175,934 B1 | 1/2001 | Hershey et al. |
| 6,216,066 B1 | 4/2001 | Goebel et al. |

FOREIGN PATENT DOCUMENTS

| | | |
|---|---|---|
| JP | 07153002 | 6/1995 |
| JP | 07221369 | 8/1995 |

*Primary Examiner*—William A. Cuchlinski, Jr.
*Assistant Examiner*—Edward Pipala
(74) *Attorney, Agent, or Firm*—Carl A. Rowold, Esq.; Beusse Brownlee Bowdoin & Wolter PA; Enrique J. Mora, Esq.

(57) ABSTRACT

A method and system for predicting failures in a power resistive grid in a vehicle, e.g., a locomotive, are provided. The method allows for monitoring one or more signals indicative of an estimated grid resistance value. The method farther allows for adjusting the value of the estimated grid resistance relative to a nominal grid resistance value. A comparing step allows for comparing the adjusted value of the grid resistance against the nominal grid resistance value to determine the performance of the respective resistive grid.

24 Claims, 5 Drawing Sheets

METHOD AND SYSTEM FOR PREDICTING FAILURES IN A POWER RESISTIVE GRID OF A VEHICLE

The present invention claims the benefit of U.S. provisional application Ser. No. 60/162,303, filed Oct. 28, 1999.

BACKGROUND OF THE INVENTION

The present invention relates generally to vehicles, e.g., locomotives, electric or hybrid buses, etc., having resistive grids for dissipating substantial electrical power, and, more particularly, to a system and method for predicting impending failures in the resistive grids of the vehicle.

The description below is given for purposes of illustration and not of limitation in the context of a locomotive. As will be appreciated by those skilled in the art, a locomotive is a complex electromechanical system comprised of several complex subsystems. Each of these subsystems, such as the resistive grids, is built from components which over time fail. The ability to automatically predict failures before they occur in the locomotive subsystems is desirable for several reasons. For example, in the case of the power-dissipating resistive grids, that ability is important for reducing the occurrence of primary failures which result in stoppage of cargo and passenger transportation. These failures can be very expensive in terms of lost revenue due to delayed cargo delivery, lost productivity of passengers, other trains delayed due to the failed one, and expensive on-site repair of the failed locomotive. Further, some of those primary failures could result in secondary failures that in turn damage other subsystems and/or components. It will be further appreciated that the ability to predict failures before they occur in the resistive grids would allow for conducting condition-based maintenance, that is, maintenance conveniently scheduled at the most appropriate time based on statistically and probabilistically meaningful information, as opposed to maintenance performed regardless of the actual condition of the subsystems, such as would be the case if the maintenance is routinely performed independently of whether the subsystem actually needs the maintenance or not. Needless to say, a condition-based maintenance is believed to result in a more economically efficient operation and maintenance of the locomotive due to substantially large savings in cost. Further, such type of proactive and high-quality maintenance will create an immeasurable, but very real, good will generated due to increased customer satisfaction. For example, each customer is likely to experience improved transportation and maintenance operations that are even more efficiently and reliably conducted while keeping costs affordable since a condition-based maintenance of the locomotive will simultaneously result in lowering maintenance cost and improving locomotive reliability.

In one example of a diesel locomotive that may be propelled by DC traction motors, a pair of traction motors may be connected in parallel, and the resistive grid is connected in series between them. When the locomotive is motoring, the voltage drop across each traction motor is similar in magnitude and polarity, and as such, there is an insignificant voltage drop across the resistive grid. While using dynamic braking, however, the polarity of one of the traction motors is reversed, creating a substantial voltage drop across the resistive grid. Thus, in this example, the resistive grid is in constant electrical contact with the traction motors, yet dissipates energy only when the locomotive employs the dynamic braking technique, or when the resistive grid is used to test load the power alternator of the locomotive during a self-load mode of operation during which the traction motors are effectively disconnected and thus the self-load testing mode is performed without moving the locomotive. It will be appreciated that the foregoing modes of operation, i.e., dynamic braking and self-load testing, are not limited to locomotives using DC traction motors since such modes of operation are also typically available in locomotives using AC traction motors.

Problems may arise in the dynamic braking subsystem, however, when a resistive grid develops a short circuit to ground or to another element of the grid. Because, in some locomotives, the resistive grids may be permanently coupled to the traction motors, a short circuit can interrupt the current flow to the traction motors. Consequently, the locomotive can be completely disabled by an element that isn't even involved in the actual propulsion of the locomotive. For example, short circuits may develop due to insulation loss in the resistive grid, or be caused by inadvertent damage during maintenance procedures. The likelihood of short circuits is enhanced by the fact that the grids are folded accordion style and packed tightly together to maximize heat transfer per area. When a short develops, the massive amount of electrical energy generated to propel the locomotive is diverted to ground. Attempting to operate a locomotive with a grounded resistive grid may cause damage to the locomotive's electrical generation and propulsion systems, as well as the resistive grid itself. Thus, a locomotive with a grounded resistive grid may be disabled until the ground fault can be corrected. As suggested above, it is desired to develop a predictive diagnostic strategy that is suitable to predict incipient failures in the resistive grids.

Previous attempts to overcome the above-mentioned issues have been generally limited to diagnostics after a problem has occurred, as opposed to prognostics, that is, predicting a failure prior to its occurrence. For example, previous attempts to diagnose problems occurring in a locomotive have been performed by experienced personnel who have in-depth individual training and experience in working with locomotives. Typically, these experienced individuals use available information that has been recorded in a log. Looking through the log, the experienced individuals use their accumulated experience and training in mapping incidents occurring in locomotive subsystems to problems that may be causing the incidents. If the incident-problem scenario is simple, then this approach works fairly well for diagnosing problems. However, if the incident-problem scenario is complex, then it is very difficult to diagnose and correct any failures associated with the incident and much less to prognosticate the problems before they occur.

Presently, some computer-based systems are being used to automatically diagnose problems in a locomotive in order to overcome some of the disadvantages associated with completely relying on experienced personnel. Once again, the emphasis on such computer-based systems is to diagnose problems upon their occurrence, as opposed to prognosticating the problems before they occur. Typically, such computer-based systems have utilized a mapping between the observed symptoms of the failures and the equipment problems using techniques such as a table look up, a symptom-problem matrix, and production rules. These techniques may work well for simplified systems having simple mappings between symptoms and problems. However, complex equipment and process diagnostics seldom have simple correspondences between the symptoms and the problems. Unfortunately, as suggested above, the usefulness of these techniques have been generally limited to diagnostics and thus even such computer-based systems have not been able to provide any effective solution to being able to predict failures before they occur.

In view of the above-mentioned considerations, there is a general need to be able to quickly and efficiently prognosticate any failures before such failures occur in the fuel delivery subsystem of the locomotive, while minimizing the need for human interaction and optimizing the repair and maintenance needs of the subsystem so as to able to take corrective action before any actual failure occurs.

BRIEF SUMMARY OF THE INVENTION

Generally speaking, the present invention fulfills the foregoing needs by providing a method for predicting failures in a respective resistive grid in a locomotive. The method allows for monitoring one or more signals indicative of an estimated grid resistance value. The method further allows for adjusting the value of the estimated grid resistance relative to a nominal grid resistance value. A comparing step allows for comparing the adjusted value of the grid resistance against the nominal grid resistance value to determine the performance of the respective resistive grid.

The present invention further fulfills the foregoing needs by providing a system for predicting failures in a respective grid of power resistors in a locomotive. The system includes a signal monitor configured to monitor respective signals indicative of an estimated grid resistance value. A first module is coupled to receive the value of the estimated grid resistance for adjusting the received grid resistance value relative to a nominal grid resistance value so as to generate an adjusted grid resistance value. A second module is coupled to receive the adjusted grid resistance value for comparing that value against the nominal grid resistance value so as to determine the performance of the respective resistor grid.

BRIEF DESCRIPTION OF THE DRAWINGS

The features and advantages of the present invention will become apparent from the following detailed description of the invention when read with the accompanying drawings in which.

DETAILED DESCRIPTION OF THE INVENTION

Figure 1:
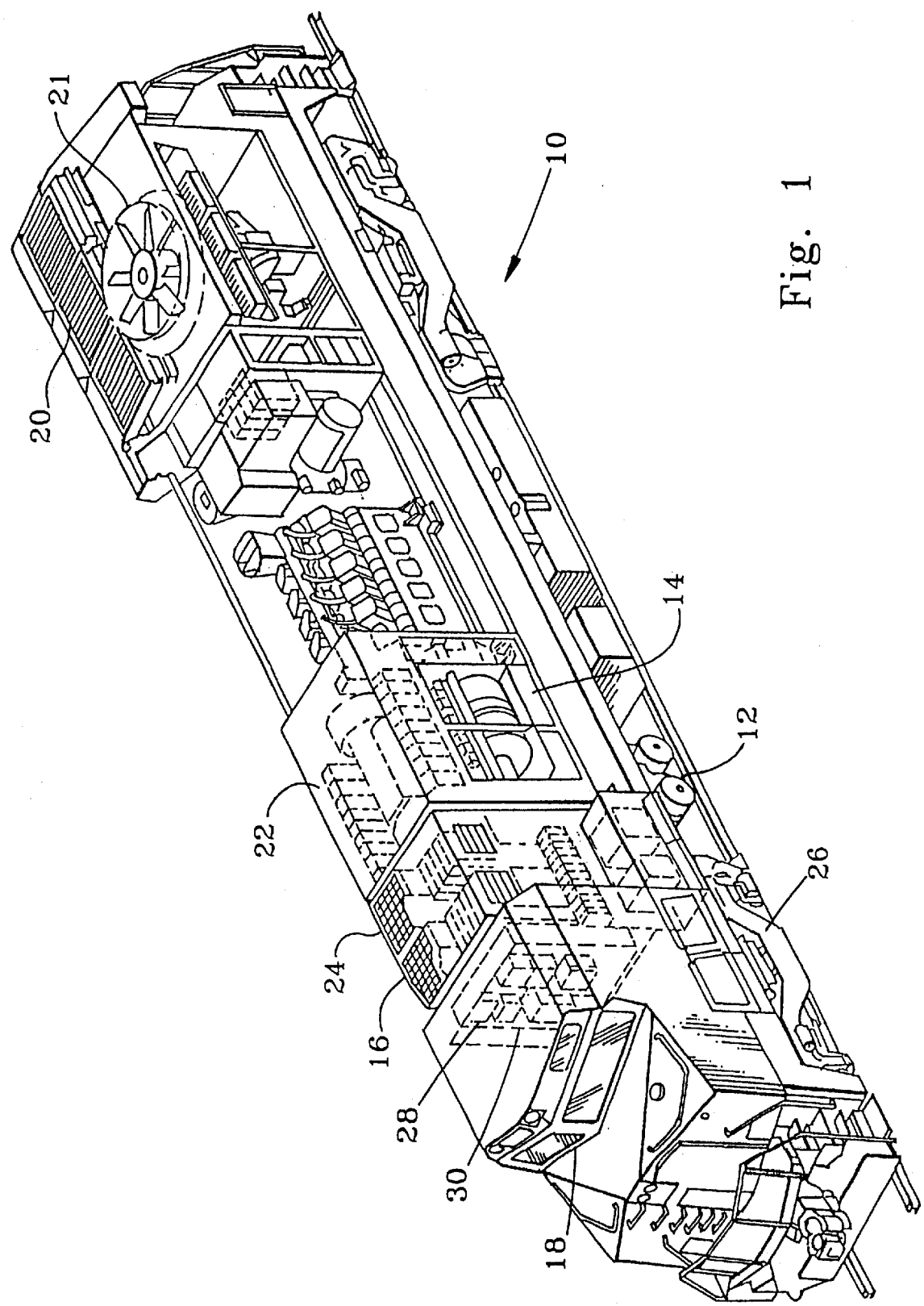
FIG. 1 shows an exemplary schematic of a locomotive.

FIG. 1 shows a schematic of a locomotive 10, that may be either an AC or DC locomotive. As will be appreciated by those skilled in the art, the locomotive 10 is comprised of several relatively complex subsystems, each performing separate functions. By way of background some of the subsystems and their functions are listed below.

An air and air brake subsystem 12 provides compressed air to the locomotive, which uses the compressed air to actuate the air brakes on the locomotive and cars behind it.

An auxiliary alternator subsystem 14 powers all auxiliary equipment. In particular, subsystem 14 supplies power directly to an auxiliary blower motor and an exhauster motor. Other equipment in the locomotive is powered through a cycle skipper.

A battery and cranker subsystem 16 provides voltage to maintain the battery at an optimum charge and supplies power for operation of a DC bus and a HVAC system.

A communications subsystem collects, distributes, and displays communication data across each locomotive operating in hauling operations that use multiple locomotives.

A cab signal subsystem 18 links the wayside to the train control system. In particular, the system 18 receives coded signals from the rails through track receivers located on the front and rear of the locomotive. The information received is used to inform the locomotive operator of the speed limit and operating mode.

A distributed power control subsystem provides remote control capability of multiple locomotive-consists anywhere in the train. It also provides for control of tractive power in motoring and braking, as well as air brake control.

An engine cooling subsystem 20 provides the means by which the engine and other components reject heat to the cooling water. In addition, it minimizes engine thermal cycling by maintaining an optimal engine temperature throughout the load range and prevents overheating in tunnels.

An end of train subsystem provides communication between the locomotive cab and the last car via a radio link for the purpose of emergency braking.

An equipment ventilation subsystem 22 provides the means to cool the locomotive equipment.

An event recorder subsystem records FRA required data and limited defined data for operator evaluation and accident investigation. For example, such recorder may store about 72 hours or more of data.

For example, in the case of a locomotive that uses one or more internal combustion engines, such as a diesel engine or prime mover 58 that provides torque to the alternator for powering the traction motors and auxiliary subsystems, a fuel monitoring subsystem provides means for monitoring the fuel level and relaying the information to the crew.

A global positioning subsystem uses NAVSTAR satellite signals to provide accurate position, velocity and altitude measurements to the control system. In addition, it also provides a precise UTC reference to the control system.

A mobile communications package subsystem provides the main data link between the locomotive and the wayside via a 900 MHz radio.

A propulsion subsystem 24 provides the means to move the locomotive. It also includes the traction motors and dynamic braking capability. In particular, the propulsion subsystem 24 receives electric power from the traction alternator and through the traction motors, converts that power to locomotive movement. The propulsion subsystem may include speed sensors that measure wheel speed that may be used in combination with other signals for controlling wheel slip or creep either during motoring or braking modes of operation using control techniques well-understood by those skilled in the art. As suggested above, once the locomotive is in motion, the traction motors may be configured to generate electricity instead of consuming it. As generators, the traction motors convert the locomotive's kinetic energy into electrical energy, thereby slowing the locomotive. Using the traction motors to reduce speed is called dynamic braking. Because there is no suitable storage medium for the generated electrical energy, an electrically resistive grid, known as a braking grid or load box, is used to convert the electrical energy into heat energy, which is vented to the atmosphere. As will be discussed in greater detail below, predicting incipient failures in the resistive grids is of particular interest.

A shared resources subsystem includes the I/O communication devices, which are shared by multiple subsystems.

A traction alternator subsystem 26 converts mechanical power to electrical power which is then provided to the propulsion system.

A vehicle control subsystem reads operator inputs and determines the locomotive operating modes.

The above-mentioned subsystems are monitored by one or more locomotive controllers, such as a locomotive control system 28 located in the locomotive. The locomotive control system 28 keeps track of any incidents occurring in the subsystems with an incident log. An on-board diagnostics subsystem 30 receives the incident information supplied from the control system and maps some of the recorded incidents to indicators. The indicators are representative of observable symptoms detected in the subsystems. Further background information regarding an exemplary diagnostic subsystem may be found in U.S. Pat. No. 5,845,272, assigned to the same assignee of the present invention and herein incorporated by reference.

Figure 2:
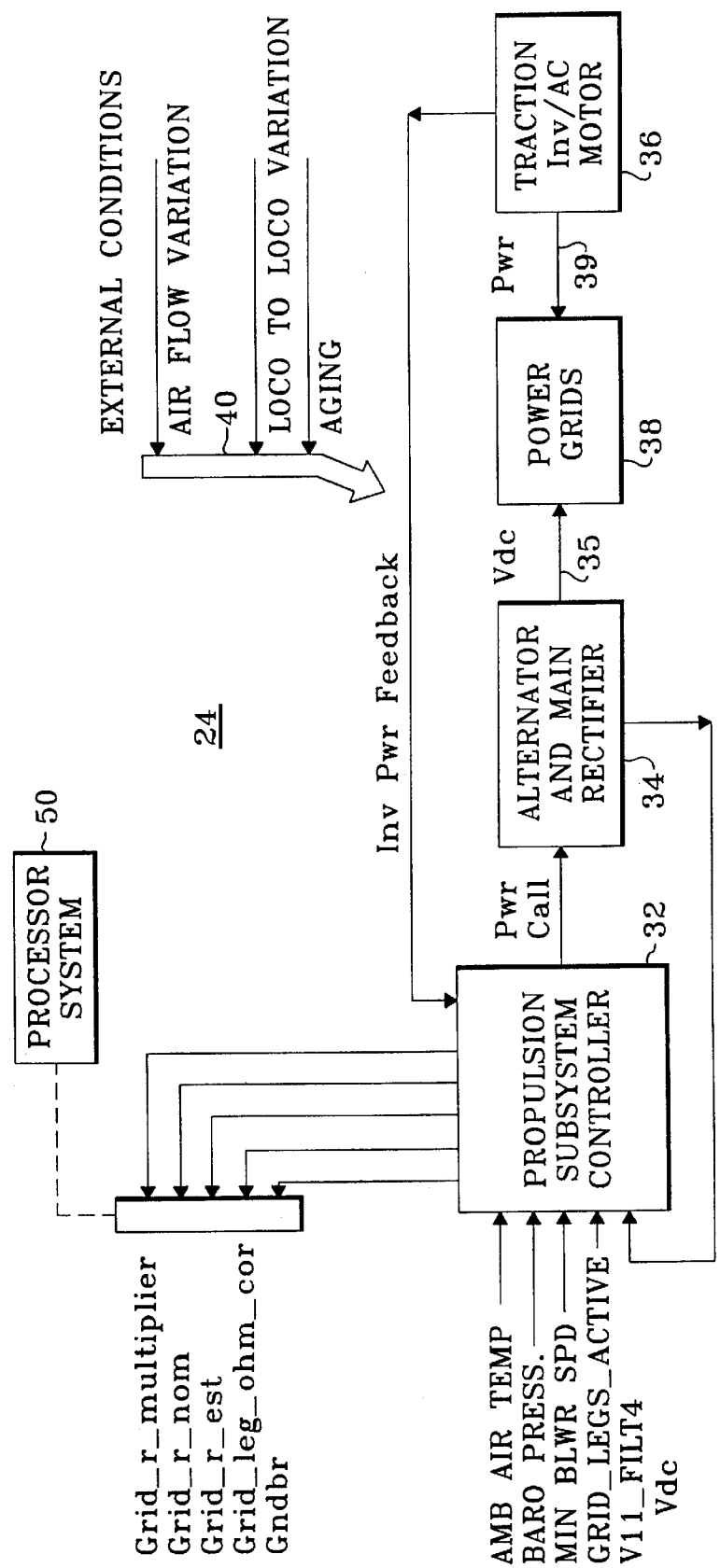
FIG. 2 shows an exemplary propulsion subsystem that uses a power resistive grid.

FIG. 2 shows further details of propulsion subsystem 24 wherein a propulsion controller 32 issues a power demand or call signal to an alternator and rectifier subsystem 34 so as to supply through a DC link 35 a DC voltage that, upon suitable conversion by one or more inverters using power conversion techniques well-understood in the art, allows for powering up the traction motors of the locomotive. For the sake of simplicity of illustration, the traction motors and inverter are collectively depicted through block 36. As described above, the resistive grids 38 allow the propulsion subsystem for dissipating substantial electrical power when the locomotive is engaged in the dynamic braking mode of operation. Similarly, the resistive grids are used in the self-load mode of operation that allows for making a circuit that electrically couples the resistive grid in lieu of the traction motors and permits to test the propulsion subsystem without actually moving the locomotive. It will be appreciated that accurately detecting changes or trends in the value of the grid resistance would be helpful to determine any degradation in the resistive grid. However, since the resistive grids are generally rated within a predetermined tolerance, e.g., +/−5%, and further since the value of the resistive grid is subject to variation due to various external conditions, collectively represented by main arrow 40. Examples of the such external conditions may include but need not be limited to air flow variation, aging of the components, variation from locomotive-to-locomotive, etc. In order to accurately detect any changes indicative of degradation in the resistive grid, it would be desirable to accurately account for changes in the value of the resistive grid due to such external conditions so as to avoid falsely declaring an actual deterioration of a respective grid, or, conversely, to avoid detection of true deterioration in the power grid due to resistance changes due to the external conditions. Accordingly, controller 32 includes an algorithm that compensates for resistance changes due to temperature variation and other external conditions that may affect the resistance of the power grid, such as barometric pressure, air flow through the grid, aging, etc., using techniques well-understood in the art. It will be appreciated that the value of the resistive grid may be estimated by monitoring or measuring the DC link voltage supplied by rectifier subsystem as well as the electrical power supplied into the power grid. In the dynamic braking mode of operation, the direction of power flow into the power grid will be as indicated by the direction of arrow 39, that is, power will be supplied from the traction motors into the power grid. Conversely, in the self-load, power flow will be from rectifier subsystem 34 into power grid 38. As shown in FIG. 2, controller 32 respectively outputs a signal indicative of an estimated grid resistance value, designated as Grid_r_est, and a signal indicative of a nominal grid resistance value, designated as Grid_r_nom, which is conveniently adjusted to account for resistance changes due to temperature variation and other external conditions. As suggested above, the estimated grid resistance value may be computed based on the following relationship:

$$\text{Grid\_r\_est} = Vdc^2/Pwr, \qquad \text{Eq. 1}$$

wherein Vdc represents the value of the DC link voltage, and Pwr represents the electrical power supplied into the resistive grid.

As will be appreciated by those skilled in the art, suitable normalization about the nominal value of the resistive grid may be obtained by computing the ratio of Grid_r_est over Grid_r_nom, so as to obtain a multiplier factor represented by grid_r_multiplier in the following equation:

$$\text{Grid\_r\_multiplier} = \text{Grid\_r\_est}/\text{Grid\_r\_nom}, \qquad \text{Eq. 2}$$

It will be appreciated that the computation of the multiplier factor could be performed by controller 32, or could be performed external to the controller. It will be further appreciated that depending on the specific application, any of the foregoing signals could be substantially filtered to reduce the effects of transients that may occur in the propulsion subsystem.

A processor system 50 may be coupled to propulsion subsystem 28 to monitor and collect the various signals that would allow the processor to assess the condition of a respective resistive grid. It will be appreciated that processor system 50 may be installed on-board or could be installed at a remote diagnostics site that would allow a service provider to monitor a fleet of locomotives. By way of example, signal transmission from the locomotive to the diagnostics site could be implemented using a suitable wireless data communication system and the like.

Figure 3:
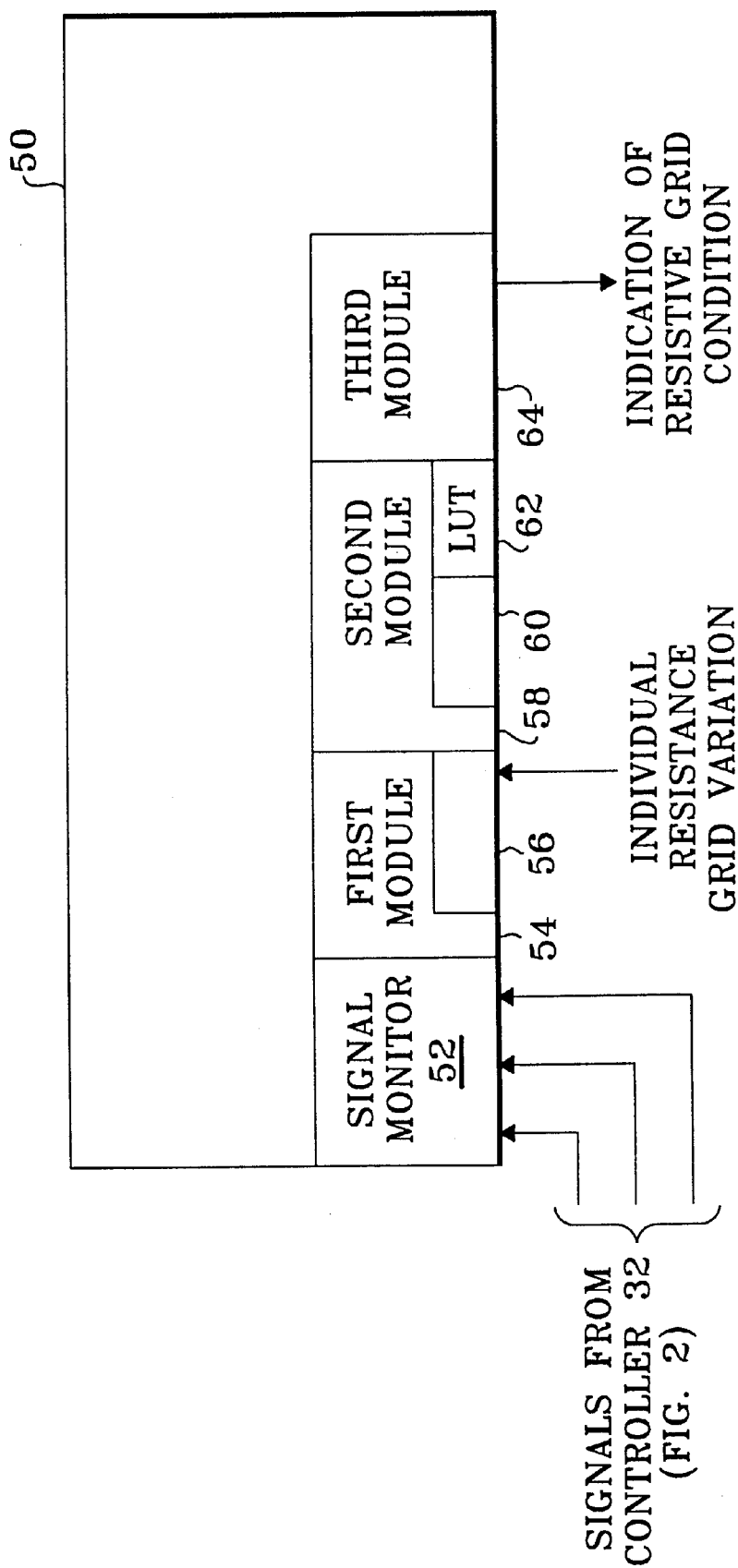
FIG. 3 shows a block diagram representation of a processor system that can be used for predicting impending failures in the power grid of FIG. 2.

FIG. 3 shows further details regarding processor system 50 that includes a signal monitor 52 that receives the signal indicative of the estimated grid resistance value, designated as Grid_r_est, the signal indicative of the nominal grid resistance value, designated as Grid_r_nom, and the Grid_r_multiplier signal supplied by controller 32 that, as suggested above, could be substantially filtered so that its effective time constant is relatively long to remove effects of transients. For example, a suitable transfer function that is useful to asses the condition of the resistive grid is as follows:

$$\text{grid\_r\_error\_1} = \text{Grid\_r\_est}/\text{Grid\_r\_nom} + K_1, \qquad \text{Eq. 3}$$

wherein grid_r_error_1 represents an adjusted value for the resistive grid, Grid_r_est, and Grid_r_nom respectively represent the estimated and nominal value for the resistive grid, as supplied by controller 32 and $K_1 = (1 − (\text{Grid\_r\_est}/\text{Grid\_r\_nom})$ averaged over a predetermined period of data collection An alternative transfer function that may be used individually or in combination with the foregoing transfer function is as follows:

$$\text{grid\_r\_error\_2} = \text{grid\_r\_multiplier} + K_2, \quad \text{Eq. 4}$$

wherein grid_r_error_2 represents the adjusted value for the resistive grid, Grid_r_multiplier represents the multiplier factor for the resistive grid, as supplied by controller 32 and $K_2 = (1 - \text{Grid\_r\_multiplier})$ averaged over a predetermined period of data collection Since, as suggested above, the Grid_r_multiplier signal has a relatively long time constant, it will be appreciated that the difference between the above transfer functions will be reflected in their respective time constants. Thus, in the event that monitoring of relatively short term variation of the power grid is desired, then the transfer function of Eq. 3 could be conveniently used. Conversely, if monitoring of substantially smoothed variation is desired, then the transfer function of Eq. 4 could be conveniently used.

As shown in FIG. 3, a first module 54 is coupled to signal monitor 52 to adjust the monitored signal or signals for deviations from the estimated nominal grid resistance value due to predetermined external variables, such as locomotive-to-locomotive variation, to generate an adjusted grid resistance value. As represented in Eqs. 3 and 4 above, the adjusted grid resistance value is the signal represented by Grid_r_error, and the adjusting factor is respectively represented by parameters $K_1$ and $K_2$. The adjusting factors may be empirically or experimentally derived by collecting actual data and/or simulation data that takes into account multiple scenarios of locomotive operation, and should preferably include a sufficiently large sample of locomotives and/or propulsion subsystems so as to statistically demonstrate the validity and accuracy of the correcting factors. A submodule 56 in first module 54 allows for retrieving and/or generating the respective adjusting factors. A second module 58 is electrically coupled to first module 54 to receive the adjusted grid resistance value. Second module 58 includes a respective submodule 60 that allows for comparing the value of the adjusted grid resistance value against the nominal grid resistance value to determine the condition of the power grids. A memory unit 62 may be used for storing a programmable look-up table for storing a first range of grid resistance values so that adjusted grid resistance values within that first range are indicative of acceptable resistive grid performance. The look-up table in memory unit 62 may further be used for storing a second range of grid resistance values so that adjusted values within the second range are indicative of degraded resistive grid performance. A third module 64 may be readily used for generating and issuing a signal indicative of a degraded resistive grid performance when the adjusted grid resistance value is beyond the first range of grid resistance values and within the second range of grid resistance values, that is, a cautionary signal that could be analogized to a yellow light in a traffic light. Similarly, module 64 may be used for generating and issuing a signal indicative of unacceptable resistive grid performance when the adjusted grid resistance value is beyond an upper limit of the second range of grid resistance values, that is, a warning signal that could be analogized to a red light in a traffic light that requires immediate action by the operator. An exemplary first range of values may be grid resistance values ranging within about +/−2% of the nominal value. An exemplary second range may range from about +/−2% to about +/−3% of the nominal value. Thus, for the above ranges, if the respective results of Eqs. 3 and/or 4, exceed +/−3% from the nominal value, then third module 64 will issue the red warning signal. Similarly, if the respective results of Eqs. 3 and/or 4, are within the second range of values, then module 64 will issue the yellow cautionary signal. Finally, if the respective results of Eqs. 3 and/or 4, are within the first range of values, then module 64 will conveniently indicate that the status of the resistive grid is within acceptable levels of performance.

Figures 4, 5A:
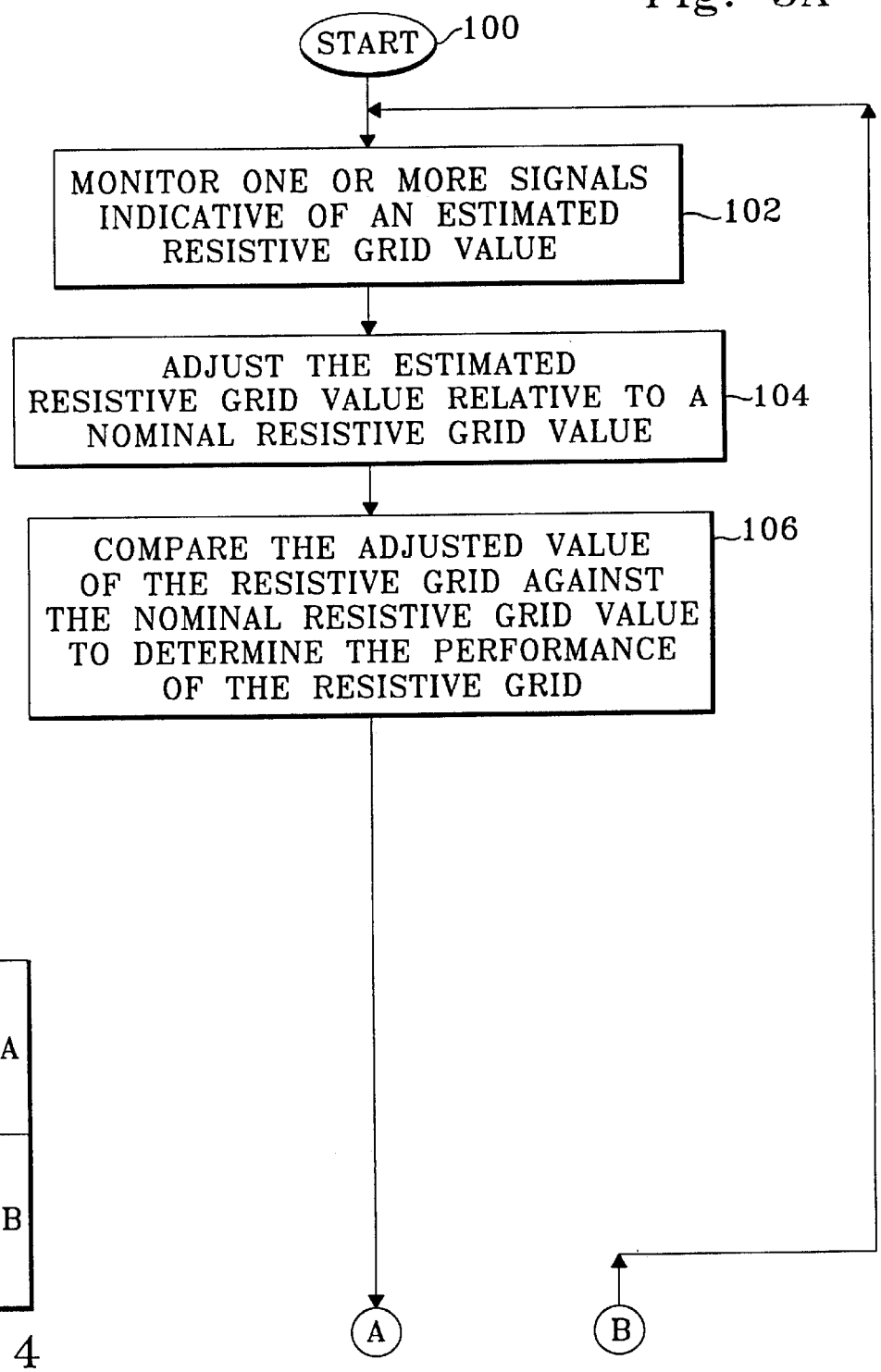
FIG. 4 is an exemplary flow chart of a method for predicting impending failures in the power grid.
Figure 5B:
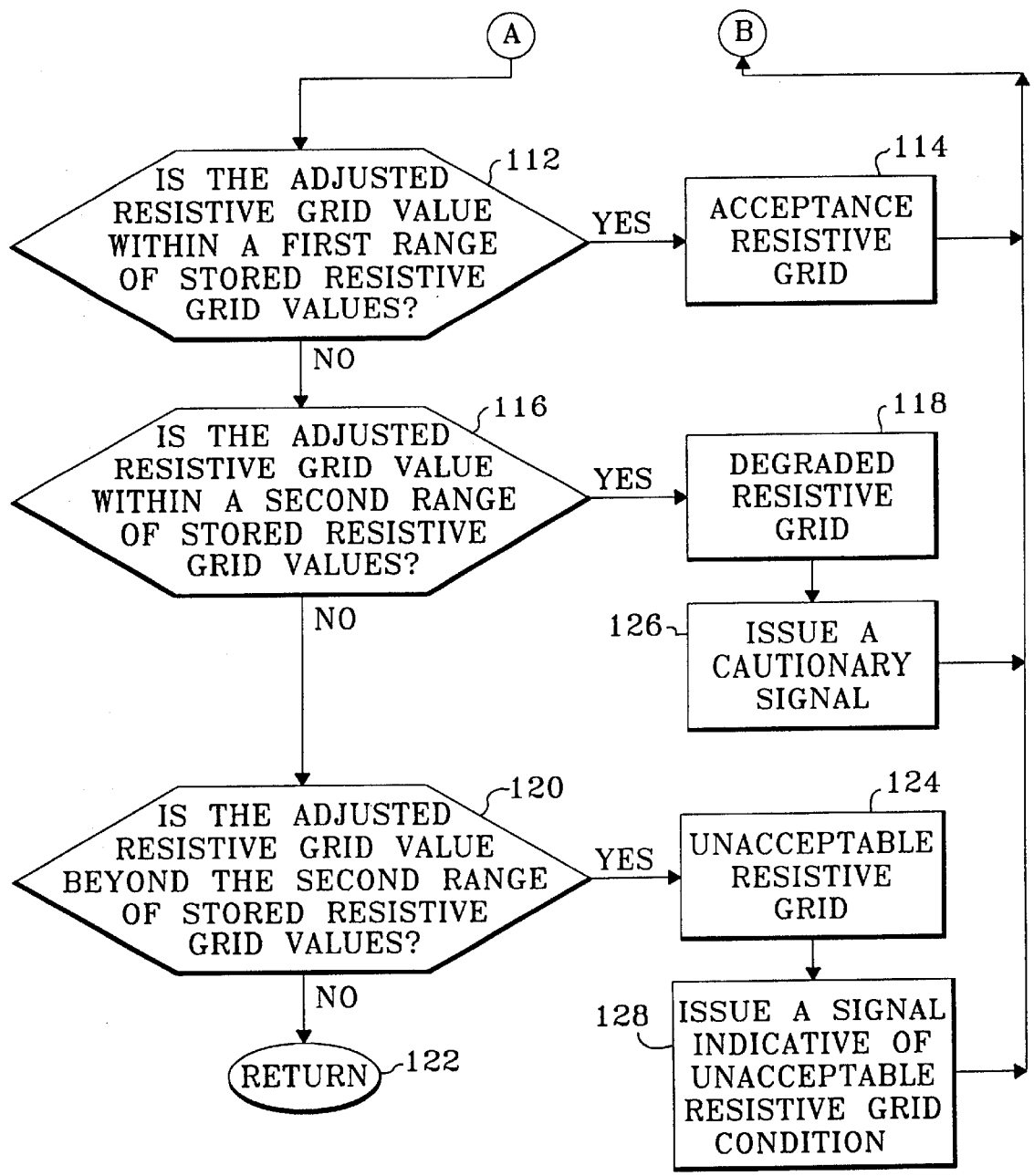
FIG. 5 illustrates further steps to the flow chart of FIG. 4 that allow for monitoring the performance of the power grid.

FIG. 4 is an exemplary flow chart of the method of the present invention for determining degradation in the condition of the power resistive grids of the locomotive. Upon start of operations in step 100, step 102 allows for monitoring one or more signals indicative of an estimated resistance value of the power grid. Step 104 allows for adjusting the value of the monitored signal for deviations from a nominal resistance value due to predetermined external variables or conditions to generate an adjusted grid resistance value. Step 106 allows for comparing the value of the adjusted grid resistance value against the nominal grid resistance value to determine the condition of the respective power grid. Through connecting node A, step 112 allows for determining whether the adjusted grid resistance value is within the first range of grid resistance value stored in the LUT. If the answer is yes, then step 114 allows for declaring that the power grid has acceptable performance and the method is ready to start another iteration through connecting node B. If the answer is no, in step 112, then step 116 allows for determining whether the adjusted grid resistance value is within a second range of grid resistance value stored in the LUT. If the answer is yes, then step 118 allows for declaring that the power grid has degraded. If the answer is no, then step 120, prior to return step 122, allows for determining whether the grid resistance value exceeds the upper limit of the second range of grid resistance value stored in the LUT. If the answer is yes, then step 124 allows for declaring or indicating an unacceptable power grid performance. This indication will generally require suitable corrective action by the user. As discussed in the context of FIG. 3, step 126 allows for issuing the yellow cautionary signal, that is, a signal indicative of power grid degradation. Similarly, step 128 allows for issuing the high-level warning signal that could be analogized to a red light in a traffic light that requires immediate action by the operator. It will be appreciated that the detection technique of the present invention can be conveniently "fine-tuned" or optimized by collecting actual locomotive or simulation data that allows for measuring the predicting accuracy of the detection algorithm by using well-understood statistical tools that enable to compute the probability that in fact an actual degradation condition will be detected.

While the preferred embodiments of the present invention have been shown and described herein, it will be obvious that such embodiments are provided by way of example only. Numerous variations, changes and substitutions will occur to those of skill in the art without departing from the invention herein. Accordingly, it is intended that the invention be limited only by the spirit and scope of the appended claims.

What is claimed is:

1. A method for determining degradation of resistive grid performance in a vehicle, the method comprising:

sensing one or more signals indicative of estimated grid resistance values, the estimated grid resistance values constituting a first set of grid resistance values influenced at least in part by a first set of operational and environmental conditions of the resistive grid;

monitoring at least one variable associated with the resistive grid at the time of the sensing of the estimated grid resistance values, said at least one variable being indicative of the first set of operational and environmental conditions of the resistive grid;

providing a database of nominal grid resistance values based on data collected from a plurality of resistive grids corresponding to the resistive grid whose performance is being determined, the nominal grid resistance values constituting a second set of grid resistance values relative to a second set of operational and environmental conditions for the resistive grids;

accessing the database in light of the first set of operational and environmental conditions;

adjusting the respective values of one of the first and second sets of grid resistance values relative to the other to account for differences between the first and second sets of operational and environmental conditions; and comparing the respective set of adjusted values against said other set of grid resistance values to determine the relative performance of the resistive grid to the plurality of resistive grid for detection of incipient failures of the resistive grid.

2. The method of claim 1 wherein the first set of grid resistance values is adjusted relative to the differences between the first and second sets of operational and environmental conditions.

3. The method of claim 1 wherein the second set of grid resistance values is adjusted relative to the differences between the first and second sets of operational and environmental conditions.

4. The method of claim 1 further comprising storing the adjusted values over time and determining trends in the adjusted values indicative of incipient failures of the resistive grid.

5. The method of claim 1 wherein said method is locally performed relative to the resistive grid.

6. The method of claim 1 further comprising transmitting the resistance grid values to a remote site and the comparing is performed at the remote site to determine the performance of the resistive grid.

7. The method of claim 1 further comprising a step of storing a first range of resistance values so that respective adjusted resistance values within that first range are indicative of satisfactory resistive grid performance.

8. The method of claim 7 further comprising a step of storing a second range of resistance values so that respective adjusted resistance values within that second range are indicative of incipient malfunctions of the resistive grid.

9. The method of claim 8 wherein respective adjusted resistance values beyond that second range of values are indicative of unacceptable resistive grid performance.

10. The method of claim 1 wherein the variable associated with the resistive grid is selected from the group consisting of ambient air temperature, air flow variation, resistive grid age, and expected variation from resistive grid-to-resistive grid.

11. The method of claim 1 further comprising generating a respective adjusting factor for the at least one variable and wherein each adjusting factor is generated based on a predetermined compensation equation for said at least one variable.

12. The method of claim 1 wherein the sensing of the one or more signals indicative of estimated grid resistance comprises sensing voltage and power applied to the resistive grid while in a self-load mode of operation.

13. A system for determining degradation of resistive grid performance in a vehicle, the system comprising:

at least one sensor configured to sense one or more signals indicative of estimated grid resistance values, the estimated grid resistance values constituting a first set of grid resistance values influenced at least in part by a first set of operational and environmental conditions of the resistive grid;

a module for monitoring at least one variable associated with the resistive grid at the time of the sensing of the estimated grid resistance values, said at least one variable being indicative of the first set of operational and environmental conditions of the resistive grid;

a database of nominal grid resistance values based on data collected from a plurality of resistive grids corresponding to the resistive grid whose performance is being determined, the nominal grid resistance values constituting a second set of grid resistance values relative to a second set of operational and environmental conditions for the resistive grids;

a processor configured to access the database in light of the first set of operational and environmental conditions, the processor including;

an adjuster module configured to adjust the respective values of one of the first and second sets of grid resistance values relative to the other to account for differences between the first and second sets of operational and environmental conditions; and a comparator configured to compare the respective set of adjusted values against said other set of grid resistance values to determine the relative performance of the resistive grid to the plurality of resistive grids for detection of incipient failures of the resistive grid.

14. The system of claim 13 wherein the first set of grid resistance values is adjusted relative to the differences between the first and second sets of operational and environmental conditions.

15. The system of claim 13 wherein the second set of grid resistance values is adjusted relative to the differences between the first and second sets of operational and environmental conditions.

16. The system of claim 13 further comprising memory for storing the adjusted values over time and determining trends in the adjusted values indicative of incipient failures of the resistive grid.

17. The system of claim 13 wherein said system is locally situated relative to the resistive grid.

18. The system of claim 13 further comprising a communications device configured to transmit the grid resistance values to a remote site and the processor is located at the remote site to determine the performance of the resistive grid.

19. The system of claim 13 further comprising memory for storing a first range of grid resistance values so that respective adjusted resistance values within that first range are indicative of satisfactory resistive grid performance.

20. The system of claim 19 wherein said memory is further configured to store a second range of grid resistance values so that respective adjusted resistance values within that second range are indicative of incipient malfunctions of the resistive grid.

21. The system of claim 20 wherein respective adjusted grid resistance values beyond that second range of values are indicative of unacceptable resistive grid performance.

22. The system of claim 13 wherein the at least one variable associated with the fuel pump is selected from the group consisting of ambient air temperature, air flow variation, resistive grid age, and expected variation from resistive grid-to-resistive grid.

23. The system of claim 13 further comprising a module for generating a respective adjusting factor for the at least one variable and wherein each adjusting factor is generated based on a predetermined compensation equation for said at least one variable.

24. The system of claim 13 wherein the one or more sensors for sensing of the one or more signals indicative of estimated grid resistance are coupled to sense voltage and power applied to the resistive grid while in a self-load mode of operation.

* * * * *